(12) United States Patent
Chou (10) Patent No.: US 8,080,727 B2
(45) Date of Patent: Dec. 20, 2011

(54) SOLAR CELL MODULES COMPRISING AN ENCAPSULANT SHEET OF A BLEND OF ETHYLENE COPOLYMERS

(75) Inventor: Richard T. Chou, Hockessin, DE (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 418 days.

(21) Appl. No.: 12/276,846

(22) Filed: Nov. 24, 2008

(65) Prior Publication Data

US 2010/0126557 A1 May 27, 2010

(51) Int. Cl.
*H01L 31/042* (2006.01)
*H01L 31/00* (2006.01)

(52) U.S. Cl. ......... 136/251; 136/244; 136/252; 136/259

(58) Field of Classification Search .................. 136/251, 136/259
See application file for complete search history.

(56) References Cited

U.S. PATENT DOCUMENTS

| | | |
|---|---|---|
| 2,897,183 A | 7/1959 | Christl et al. |
| 3,350,372 A | 10/1967 | Anspon et al. |
| 4,347,341 A | 8/1982 | Bartl et al. |
| 4,351,931 A | 9/1982 | Armitage |
| 4,588,642 A * | 5/1986 | Ochiumi ..................... 428/421 |
| 4,614,781 A | 9/1986 | Hori et al. |
| 5,028,674 A | 7/1991 | Hatch et al. |
| 5,296,554 A | 3/1994 | Watanabe et al. |
| 5,507,881 A | 4/1996 | Sichanugrist et al. |
| 5,512,107 A | 4/1996 | van den Berg |
| 5,532,066 A | 7/1996 | Latiolais et al. |
| 5,759,698 A | 6/1998 | Tanuma et al. |
| 5,859,137 A | 1/1999 | Chou |
| 5,948,176 A | 9/1999 | Ramanathan et al. |
| 5,994,163 A | 11/1999 | Bodegard et al. |
| 6,040,521 A | 3/2000 | Kushiya et al. |
| 6,042,930 A | 3/2000 | Kelch et al. |
| 6,137,048 A | 10/2000 | Wu et al. |
| 6,258,620 B1 | 7/2001 | Morel et al. |
| 6,414,236 B1 | 7/2002 | Kataoka et al. |

(Continued)

FOREIGN PATENT DOCUMENTS

GB 1157569 7/1969

(Continued)

OTHER PUBLICATIONS

Official Action issued on Dec. 3, 2010, in U.S. Appl. No. 12/276,873.

(Continued)

*Primary Examiner* — Alexa Neckel
*Assistant Examiner* — Shannon Gardner (57) ABSTRACT

Disclosed is a solar cell module comprising a polymeric encapsulant sheet, wherein the polymeric encapsulant sheet comprises a blend composition of an ethylene copolymer A and an ethylene copolymer B, the blend composition having a melt flow rate of less than 100 g/10 min, as determined in accordance with ASTM D1238 at 190° C. and 2.16 kg, and wherein the ethylene copolymer A comprises copolymerized units of ethylene and about 3 to about 20 wt % of an ester or anhydride of a $C_4$-$C_8$ unsaturated acid having two carboxylic acid groups and the ethylene copolymer B comprises copolymerized units of ethylene and about 6 to about 40 wt % of a polar monomer selected from the group consisting of vinyl acetate, alkyl (meth)acrylates, and mixtures thereof.

18 Claims, 1 Drawing Sheet

U.S. PATENT DOCUMENTS

| | | |
|---|---|---|
| 6,924,427 B2 | 8/2005 | Eckert et al. |
| 7,186,917 B1 | 3/2007 | Van De Wiele, Jr. |
| 7,199,188 B2 | 4/2007 | Chou |
| 7,279,520 B2 | 10/2007 | Hausmann et al. |
| 7,879,949 B2 * | 2/2011 | Chou .......................... 525/221 |
| 2002/0038664 A1 | 4/2002 | Zenko |
| 2005/0187315 A1 | 8/2005 | Dean |
| 2005/0228145 A1 | 10/2005 | Lacroix et al. |
| 2005/0247402 A1 | 11/2005 | Fujiki et al. |
| 2006/0025527 A1 | 2/2006 | Chou |
| 2006/0148988 A1 | 7/2006 | Chou |
| 2006/0160952 A1 | 7/2006 | Chou et al. |
| 2006/0201544 A1 | 9/2006 | Inoue |
| 2007/0079866 A1 | 4/2007 | Borden et al. |
| 2007/0155904 A1 | 7/2007 | Chou |
| 2007/0209699 A1 | 9/2007 | Sichanugrist et al. |
| 2007/0227578 A1 | 10/2007 | Perozziello et al. |
| 2007/0232057 A1 | 10/2007 | Borden et al. |
| 2007/0238285 A1 | 10/2007 | Borden |
| 2007/0240759 A1 | 10/2007 | Borden |
| 2007/0255007 A1 | 11/2007 | Dean |
| 2007/0281090 A1 | 12/2007 | Kurita et al. |
| 2007/0298590 A1 | 12/2007 | Choi et al. |
| 2008/0078445 A1 | 4/2008 | Patel et al. |
| 2008/0115825 A1 | 5/2008 | Patel et al. |
| 2008/0169023 A1 | 7/2008 | Nishijima et al. |
| 2008/0255303 A1 | 10/2008 | Chou |
| 2008/0302417 A1 | 12/2008 | Inoue et al. |
| 2009/0023867 A1 | 1/2009 | Nishijima et al. |
| 2009/0027485 A1 | 1/2009 | Erhart et al. |
| 2009/0120489 A1 | 5/2009 | Nishijima et al. |
| 2009/0274856 A1 | 11/2009 | Chou |
| 2010/0126558 A1 | 5/2010 | Samuels et al. |

FOREIGN PATENT DOCUMENTS

| | | |
|---|---|---|
| JP | 58-063178 | 4/1983 |
| JP | 62-099125 A | 5/1987 |
| JP | 06-322334 A | 11/1994 |
| JP | 08-316508 A | 11/1996 |
| JP | 09/178909 | 11/1997 |
| JP | 11/020091 | 1/1999 |
| JP | 11-026791 A | 1/1999 |
| JP | 2001-119047 A | 4/2001 |
| JP | 2001-119056 A | 4/2001 |
| JP | 2001144313 | 5/2001 |
| JP | 2004-031445 A | 1/2004 |
| JP | 2005-064266 A | 3/2005 |
| JP | 2005-064268 A | 3/2005 |
| JP | 2005-126708 A | 5/2005 |
| JP | 2005-129925 A | 5/2005 |
| JP | 2005-129926 A | 5/2005 |
| JP | 2006-032308 A | 2/2006 |
| JP | 2006-036874 A | 2/2006 |
| JP | 2006-036875 A | 2/2006 |
| JP | 2006-036876 A | 2/2006 |
| JP | 2006-159497 A | 6/2006 |
| JP | 2006-186233 A | 7/2006 |
| JP | 2006-186237 A | 7/2006 |
| JP | 2006-190865 A | 7/2006 |
| JP | 2006-210906 A | 8/2006 |
| WO | 03/035744 A1 | 5/2003 |
| WO | 03/065472 A2 | 8/2003 |
| WO | 03/099930 A1 | 12/2003 |
| WO | 2006-070793 A1 | 7/2006 |
| WO | 2006-085603 A1 | 8/2006 |
| WO | 2006-095762 A1 | 9/2006 |
| WO | 2006-095911 A1 | 9/2006 |
| WO | 2007-094445 A1 | 8/2007 |

OTHER PUBLICATIONS

Final Official Action issued on May 12, 2011, in U.S. Appl. No. 12/276,873.

* cited by examiner

SOLAR CELL MODULES COMPRISING AN ENCAPSULANT SHEET OF A BLEND OF ETHYLENE COPOLYMERS

FIELD OF THE INVENTION

The present invention is directed to solar cell modules comprising a polymeric encapsulant sheet formed of a blend of ethylene copolymers.

BACKGROUND OF THE INVENTION

Because they provide a sustainable energy resource, the use of solar cells is rapidly expanding. Solar cells can typically be categorized into two types based on the light absorbing material used, i.e., bulk or wafer-based solar cells and thin film solar cells.

Monocrystalline silicon (c-Si), poly- or multi-crystalline silicon (poly-Si or mc-Si) and ribbon silicon are the materials used most commonly in forming the more traditional wafer-based solar cells. Solar cell modules derived from wafer-based solar cells often comprise a series of self-supporting wafers (or cells) that are soldered together. The wafers generally have a thickness of between about 180 and about 240 μm. Such a panel of solar cells is called a solar cell layer and it may further comprise electrical wirings such as cross ribbons connecting the individual cell units and bus bars having one end connected to the cells and the other exiting the module. The solar cell layer is then further laminated to encapsulant layer(s) and protective layer(s) to form a weather resistant module that may be used for at least 20 years. In general, a solar cell module derived from wafer-based solar cell(s) comprises, in order of position from the front sun-facing side to the back non-sun-facing side: (1) an incident layer (or front sheet), (2) a front encapsulant layer, (3) a solar cell layer, (4) a back encapsulant layer, and (5) a backing layer (or backsheet). In such modules, it is essential that the materials positioned to the sun-facing side of the solar cell layer (i.e., the incident layer and the front encapsulant layer) have good transparency to allow sufficient sunlight to reach the solar cells. In addition, some modules may comprise bi-facial solar cells, where the solar cells are able to generate electrical power by receiving sunlight directly reaching the sun-facing side thereof and by receiving sunlight that is reflected back to the non-sun-facing side thereof. In such modules it is essential that all the materials surrounding the solar cells layer be sufficiently transparent.

The increasingly important alternative thin film solar cells are commonly formed from materials that include amorphous silicon (a-Si), microcrystalline silicon (μc-Si), cadmium telluride (CdTe), copper indium selenide ($CuInSe_2$ or CIS), copper indium/gallium diselenide ($CuIn_xGa_{(1-x)}Se_2$ or CIGS), light absorbing dyes, and organic semiconductors. By way of example, thin film solar cells are disclosed in e.g., U.S. Pat. Nos. 5,507,881; 5,512,107; 5,948,176; 5,994,163; 6,040,521; 6,137,048; and 6,258,620 and U.S. Patent Publication Nos. 2007/0298590; 2007/0281090; 2007/0240759; 2007/0232057; 2007/0238285; 2007/0227578; 2007/0209699; and 2007/0079866. Thin film solar cells with a typical thickness of less than 2 μm are produced by depositing the semiconductor layers onto a superstrate or substrate formed of glass or a flexible film. During manufacture, it is common to include a laser scribing sequence that enables the adjacent cells to be directly interconnected in series, with no need for further solder connections between cells. As with wafer cells, the solar cell layer may further comprise electrical wirings such as cross ribbons and bus bars. Similarly, the thin film solar cells are further laminated to other encapsulant and protective layers to produce a weather resistant and environmentally robust module. Depending on the sequence in which the multi-layer deposition is carried out, the thin film solar cells may be deposited on a superstrate that ultimately serves as the incident layer in the final module, or the cells may be deposited on a substrate that ends up serving as the backing layer in the final module. Therefore, a solar cell module derived from thin film solar cells may have one of two types of construction. The first type includes, in order of position from the front sun-facing side to the back non-sun-facing side, (1) a solar cell layer comprising a superstrate and a layer of thin film solar cell(s) deposited thereon at the non-sun-facing side, (2) a (back) encapsulant layer, and (3) a backing layer. The second type may include, in order of position from the front sun-facing side to the back non-sun-facing side, (1) an incident layer, (2) a (front) encapsulant layer, (3) a solar cell layer comprising a layer of thin film solar cell(s) deposited on a substrate at the sun-facing side thereof.

The encapsulant layers used in solar cell modules are designed to encapsulate and protect the fragile solar cells. Suitable polymer materials for solar cell encapsulant layers typically possess a combination of characteristics such as high impact resistance, high penetration resistance, good ultraviolet (UV) light resistance, good long term thermal stability, adequate adhesion strength to glass and other rigid polymeric sheets, high moisture resistance, and good long term weatherability. Currently, ethylene/vinyl acetate copolymers are the most widely used encapsulant material in the industry.

When solar cell modules are used in the field, it is found that if the encapsulant sheet and its adjacent layer(s) are not tightly sealed, moisture tends to enter and cause de-lamination. There is still a need to develop an encapsulant material having superior adhesion to its adjacent layer(s) and therefore improve the weatherability of the solar cell module. This is especially true in the thin film solar cell industry where the practice of providing edge seals around the peripheral edges of the modules incurs substantial cost and results in process concerns.

Blend compositions of ethylene copolymers, such as those disclosed in U.S. Patent Publication Nos. 2006/0025527, 2006/0160952 and 2006/0148988, have been found to exhibit high temperature resistance and good high frequency weldability. In addition, the blend compositions can adhere well to metals (such as aluminum) or plastics (such as polyamides and polyolefins). However, it has been found that polymeric sheets made from such ethylene copolymer blends can also form superior adhesive bonds to glass, and that such adhesive bonds are water resistant.

SUMMARY OF THE INVENTION

Disclosed herein is a solar cell module comprising a solar cell layer and a sheet comprising at least one layer of a blend composition of ethylene copolymers, wherein (A) the solar cell layer comprises a single solar cell or a plurality of electrically interconnected solar cells; and (B) the blend composition has a melt flow rate of less than 100 g/10 min, as determined in accordance with ASTM D1238 at 190° C. and 2.16 kg, and comprises: (I) about 5 to about 95 wt %, or about 5 to about 40 wt %, of an ethylene copolymer A, based on the total weight of the blend composition, wherein the ethylene copolymer A comprises copolymerized units of ethylene and about 3 to about 20 wt % of a comonomer selected from the group consisting of esters of $C_4$-$C_8$ unsaturated acids having two carboxylic acid groups, anhydrides of $C_4$-$C_8$ unsaturated acids having two carboxylic acid groups, and mixtures thereof, based on the total weight of the ethylene copolymer A; and (II) about 5 to about 95 wt %, or about 60 to about 95 wt %, of an ethylene copolymer B, based on the total weight of the blend composition, wherein ethylene copolymer B comprises copolymerized units of ethylene and about 6 to about 40 wt % of at least one polar monomer selected from the group consisting of vinyl acetate, alkyl acrylates, alkyl methacrylates, and mixtures of any two or more thereof, based on the total weight of the ethylene copolymer B, with the proviso that ethylene copolymer A and ethylene copolymer B are chemically distinct. The esters of the $C_4$-$C_8$ unsaturated acids having two carboxylic acid groups may be selected from the group consisting of monoesters of $C_4$-$C_8$ unsaturated acids having two carboxylic acid groups, diesters of $C_4$-$C_8$ unsaturated acids having two carboxylic acid groups, and mixtures of any two or more thereof. The ethylene copolymer A may comprise about 6 to about 15 wt %, or about 8 to about 15 wt %, of copolymerized units of a monoester of a $C_4$-$C_8$ unsaturated acid having two carboxylic acid groups. The ethylene copolymer B may comprise about 12 to about 32 wt % of copolymerized units of the at least one polar monomer and the at least one polar monomer may be vinyl acetate or may be selected from the group consisting of $C_1$-$C_6$ alkyl acrylates, $C_1$-$C_6$ alkyl methacrylates, and mixtures of two or more thereof.

In one embodiment, the sheet comprising the blend composition is in the form of a monolayer that consists essentially of the blend composition or in the form of a multilayer sheet that has two or more sub-layers, wherein at least one of the sub-layers consists essentially of the blend composition and each of the other sub-layers present in the multilayer sheet comprises at least one polymer selected from the group consisting of acid copolymers, ionomers of acid copolymers, ethylene/vinyl acetate copolymers, poly(vinyl acetals), polyurethanes, polyvinylchlorides, polyethylenes, polyolefin block elastomers, copolymers of an α-olefin and an α,β-ethylenically unsaturated carboxylic acid, silicone elastomers, epoxy resins, and combinations of two or more thereof.

In a further embodiment, the solar cell module may have a front sun-facing side and a back non-sun-facing side. In such an embodiment, the solar cell module may comprise a front encapsulant layer laminated to the sun-facing side of the solar cell layer and a back encapsulant layer laminated to the non-sun-facing side of the solar cell layer, wherein one of the front and back encapsulant layers is the sheet comprising the blend composition and the other of the front and back encapsulant layers comprises a polymeric material selected from the group consisting of copolymers of an α-olefin and an α,β-ethylenically unsaturated carboxylic acid, ionomers of copolymers of an α-olefin and an α,β-ethylenically unsaturated carboxylic acid, ethylene/vinyl acetate copolymers, poly (vinyl acetals), polyurethanes, polyvinylchlorides, polyethylenes, polyolefin block copolymer elastomers, copolymers of an α-olefin and an α,β-ethylenically unsaturated carboxylic acid, silicone elastomers, epoxy resins, and combinations thereof. Further, the solar cell module may further comprise an incident layer, wherein the incident layer is an outermost surface layer of the module and is positioned on the sun-facing side of the solar cell layer, and wherein the incident layer is selected from the group consisting of (a) glass sheets, (b) polymeric sheets comprising a polymer selected from the group consisting of polycarbonates, acrylics, polyacrylates, cyclic polyolefins, polystyrenes, polyamides, polyesters, fluoropolymers, and combinations of two or more thereof, and (c) polymeric films comprising a polymer selected from the group consisting of polyesters, polycarbonate, polyolefins, norbornene polymers, polystyrene, styrene-acrylate copolymers, acrylonitrile-styrene copolymers, polysulfones, nylons, polyurethanes, acrylics, cellulose acetates, cellophane, poly(vinyl chlorides), fluoropolymers, and combinations of two or more thereof. Yet further, the solar cell module may further comprise a backing layer, wherein the backing layer is an outermost surface layer of the module and is positioned on the non-light receiving side of the solar cell layer, and wherein the backing layer is selected from the group consisting of (a) glass sheets, (b) polymeric sheets, (c) polymeric films, (d) metal sheets, and (e) ceramic plates, and wherein the polymeric sheets comprise a polymer selected from the group consisting of polycarbonates, acrylics, polyacrylates, cyclic polyolefins, polystyrenes, polyamides, polyesters, fluoropolymers, and combinations or two or more thereof; and the polymeric films comprise a polymer selected from the group consisting of polyesters, polycarbonates, polyolefins, norbornene polymers, polystyrenes, styrene-acrylate copolymers, acrylonitrile-styrene copolymers, polysulfones, nylons, polyurethanes, acrylics, cellulose acetates, cellophanes, poly(vinyl chlorides), fluoropolymers, and combinations of two or more thereof.

In a yet further embodiment, the solar cells may be wafer-based solar cells selected from the group consisting of crystalline silicon (c-Si) and multi-crystalline silicone (mc-Si) based solar cells and the solar cell module may consist essentially of, in order of position, (a) an incident layer, (b) a front encapsulant layer laminated to the sun-facing side of the solar cell layer, (c) the solar cell layer, (d) a back encapsulant layer laminated to the non-light receiving side of the solar cell layer, and (e) a backing layer, wherein one or both of the front and back encapsulant layers comprises the blend composition.

In a yet further embodiment, the solar cells may be thin film solar cells selected from the group consisting of amorphous silicon (a-Si), microcrystalline silicon (μc-Si), cadmium telluride (CdTe), copper indium selenide (CIS), copper indium/gallium diselenide (CIGS), light absorbing dyes, and organic semiconductor based solar cells, and the solar cell module may (a) in one embodiment, consist essentially of, in order of position, (i) an incident layer, (ii) a front encapsulant layer comprising the sheet comprising the blend composition, and (iii) the solar cell layer, wherein the solar cell layer further comprises a substrate upon which the thin film solar cells are deposited and the substrate is positioned such that the substrate is an outermost surface of the module and is positioned on the non-sun-facing side of the solar cell layer, or (b) in another embodiment, consist essentially of, in order of position, (i) the solar cell layer, (ii) a back encapsulant layer comprising the sheet comprising the blend composition, and (iii) a backing layer, wherein the solar cell layer further comprises a superstrate upon which the thin film solar cells are deposited and the superstrate is positioned such that the superstrate is an outermost surface of the module on the sun-facing side of the solar cell layer.

Further disclosed herein is a process for preparing a solar cell module, comprising: (a) providing an assembly comprising all the component layers recited above and (b) laminating the assembly to form the solar cell module. The laminating step of the process may be conducted by subjecting the assembly to heat and optionally vacuum or pressure.

DETAILED DESCRIPTION OF THE INVENTION

Unless otherwise defined, all technical and scientific terms used herein have the same meaning as commonly understood by one of ordinary skill in the art to which this invention belongs. In case of conflict, the specification, including definitions, will control.

Although methods and materials similar or equivalent to those described herein can be used in the practice or testing of the invention, suitable methods and materials are described herein.

Unless stated otherwise, all percentages, parts, ratios, etc., are by weight.

When an amount, concentration, or other value or parameter is given as either a range, preferred range or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

When the term "about" is used in describing a value or an end-point of a range, the disclosure should be understood to include the specific value or end-point referred to.

As used herein, the terms "comprises," "comprising," "includes," "including," "containing," "characterized by," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or.

The transitional phrase "consisting essentially of" limits the scope of a claim to the specified materials or steps and those that do not materially affect the basic and novel characteristic(s) of the claimed invention.

Where applicants have defined an invention or a portion thereof with an open-ended term such as "comprising," it should be readily understood that unless otherwise stated the description should be interpreted to also describe such an invention using the term "consisting essentially of".

Use of "a" or "an" are employed to describe elements and components of the invention. This is merely for convenience and to give a general sense of the invention. This description should be read to include one or at least one and the singular also includes the plural unless it is obvious that it is meant otherwise.

In describing certain polymers it should be understood that sometimes applicants are referring to the polymers by the monomers used to produce them or the amounts of the monomers used to produce the polymers. While such a description may not include the specific nomenclature used to describe the final polymer or may not contain product-by-process terminology, any such reference to monomers and amounts should be interpreted to mean that the polymer comprises those monomers (i.e. copolymerized units of those monomers) or that amount of the monomers, and the corresponding polymers and compositions thereof.

In describing and/or claiming this invention, the term "copolymer" is used to refer to polymers formed by copolymerization of two or more monomers. Such copolymers include dipolymers, terpolymers or higher order copolymers.

Disclosed herein is solar cell module a solar cell module comprising a) at least one sheet layer (i.e., an encapsulant (sheet) layer) comprising a blend composition of ethylene copolymers and b) a solar cell layer comprised of one or a plurality of solar cells. The sheet functions as an encapsulant layer in the solar cell module.

The ethylene copolymer blend composition used herein has a melt flow rate (MFR) less than about 100 g/10 min, or less than about 85 g/10 min, or less than about 60 g/10 min, or about 1 to about 40 g/10 min, as determined in accordance with ASTM D1238 at 190° C. and 2.16 kg, and comprises (a) about 5 to about 95 wt %, or about 5 to about 40 wt %, or about 10 to about 30 wt % of an ethylene copolymer A, based on the total weight of the blend composition and (b) about 5 to about 95 wt %, or about 60 to about 95 wt %, or about 70 to about 90 wt % of an ethylene copolymer B, based on the total weight of the blend composition, wherein (i) the ethylene copolymer A comprises copolymerized units of ethylene and about 3 to about 20 wt % of copolymerized units of an ester of a $C_4$-$C_8$ unsaturated acid having two carboxylic acid groups, an anhydride of a $C_4$-$C_8$ unsaturated acid having two carboxylic acid groups, or a mixture thereof, based on the total weight of the ethylene copolymer A; and (ii) the ethylene copolymer B comprises copolymerized units of ethylene and about 6 to about 40 wt % of copolymerized units of at least one polar monomer selected from the group consisting of vinyl acetate, alkyl acrylates, alkyl methacrylates, and mixtures of any two or more thereof, based on the total weight of the ethylene copolymer B, with the proviso that the ethylene copolymer A and the ethylene copolymer B are chemically distinct copolymers. By chemically distinct copolymers is meant the comonomer units are not completely identical in the copolymers. For example, a copolymer A and a copolymer B are considered chemically distinct when copolymer A is a dipolymer of ethylene and comonomer C and copolymer B is a terpolymer of ethylene, comonomer C, and comonomer D. In a further example, a copolymer A and a copolymer B are considered chemically distinct when copolymer A is a dipolymer of ethylene and comonomer C and copolymer B is a dipolymer of ethylene and comonomer D.

The ethylene copolymer A used in the blend composition may be obtained by copolymerization of ethylene and a comonomer selected from the group consisting of monoesters of $C_4$-$C_8$ unsaturated acids having two carboxylic acid groups, diesters of $C_4$-$C_8$ unsaturated acids having two carboxylic acid groups, anhydrides of $C_4$-$C_8$ unsaturated acids having two carboxylic acid groups, and mixtures of any two or more thereof. The suitable comonomers may include $C_1$-$C_{20}$ alkyl monoesters of butenedioc acids (e.g. maleic acid, fumaric acid, itaconic acid and citraconic acid) such as methyl hydrogen maleate, ethyl hydrogen maleate, propyl hydrogen fumarate, and 2-ethylhexyl hydrogen fumarate, and $C_1$-$C_{20}$ alkyl diesters of butenedioic acids such as dimethylmaleate, diethylmaleate, dibutylcitraconate, dioctylmaleate, and di-2-ethylhexylfumarate. In one embodiment, the ethylene copolymer A is obtained by copolymerization of ethylene and methyl hydrogen maleate or ethyl hydrogen maleate. In a further embodiment, the ethylene copolymer A is obtained by copolymerization of ethylene and ethyl hydrogen maleate.

The ethylene copolymer A may be a dipolymer or a higher order copolymer, such as a terpolymer. For example, when in the form of a terpolymer, the ethylene copolymer A may further comprise less than about 5 wt % of copolymerized units of a third comonomer selected from vinyl acetate, alkyl acrylates, alkyl methacrylates, acrylic acids, methacrylic acids, and derivatives thereof, based on the total weight of the ethylene copolymer A. Suitable derivatives of acrylic acid and methacrylic acid include salts, esters, or other acid derivatives known to one of ordinary skill in the chemical arts. Preferred acid derivatives include methyl acrylate and butyl acrylate, for example.

Specific examples of the ethylene copolymer A used in the blend composition include, but are not limited to, ethylene/maleic acid monoester dipolymers (such as ethylene/ethyl hydrogen maleate dipolymer), ethylene/maleic acid monoester/n-butyl methacrylate terpolymers, ethylene/maleic acid monoester/methyl acrylate terpolymers, ethylene/maleic acid monoester/methyl methacrylate terpolymers, ethylene/maleic acid monoester/ethyl methacrylate terpolymers and ethylene/maleic acid monoester/ethyl acrylate terpolymers.

The ethylene copolymer A used in the blend composition may comprise about 3 to about 20 wt %, or about 6 to about 15 wt %, or about 8 to about 15 wt % of copolymerized units of the ester of the $C_4$-$C_8$ unsaturated acid having two carboxylic acid groups, based on the total weight of the ethylene copolymer A.

The ethylene copolymer A used in the blend composition may be synthesized by random copolymerization of ethylene and the particular comonomer(s) in a high-pressure free radical process, generally an autoclave process. Such processes are described in U.S. Pat. No. 4,351,931. Some exemplary ethylene copolymers that may be used as ethylene copolymer A are described in U.S. Patent Application Publication No. 2005/0187315.

The ethylene copolymer B used in the blend composition may comprise about 6 to about 40 wt %, or about 12 to about 32 wt % of copolymerized units of the at least one polar monomer selected from vinyl acetate, alkyl acrylates, alkyl methacrylates, and mixtures of any two or more thereof, based on the total weight of the ethylene copolymer B.

The ethylene copolymer B may be a dipolymer or a higher order copolymer, such as a terpolymer. When in the form of a higher order copolymer, the ethylene copolymer B may further comprise copolymerized units of one or more additional suitable comonomers excluding monoesters of $C_4$-$C_8$ unsaturated acids having two carboxylic acid groups, diesters of $C_4$-$C_8$ unsaturated acids having two carboxylic acid groups, and anhydrides of $C_4$-$C_8$ unsaturated acids having two carboxylic acid groups. For example, the ethylene copolymer B may be in the form of a terpolymer and further comprise less than about 5 wt % of copolymerized units of a third comonomer selected from acrylic acids, methacrylic acids and derivatives thereof, based on the total weight of the ethylene copolymer B.

In certain embodiments, the ethylene copolymer B is an ethylene/vinyl acetate copolymer comprising copolymerized units of ethylene and vinyl acetate. The ethylene/vinyl acetate copolymer may have a melt flow rate (MFR) of about 0.1 to about 1000 g/10 minutes, or about 0.3 to about 30 g/10 minutes, as determined in accordance with ASTM D1238 at 190° C. and 2.16 kg.

It is understood that the ethylene copolymer B used in the blend composition may be in the form of a single ethylene/vinyl acetate copolymer or a mixture of two or more different ethylene/vinyl acetate copolymers. By different ethylene/vinyl acetate copolymers is meant that the copolymers have different comonomer ratios. They may also be copolymers that have the same comonomer ratios, but different MFR, due to having different molecular weight distributions.

Ethylene/vinyl acetate copolymers useful herein include those available from E. I. du Pont de Nemours and Company (DuPont), Wilmington, Del. under the tradename Elvax®.

In a further embodiment, the ethylene copolymer B is an ethylene/alkyl acrylate copolymer comprising copolymerized units of ethylene and an alkyl acrylate. The alkyl moiety of the alkyl acrylate may contain 1-6 or 1-4 carbon atoms, may be selected from methyl groups, ethyl groups, and branched or unbranched propyl, butyl, pentyl, and hexyl groups. Exemplary alkyl acrylates include, but are not limited to, methyl acrylate, ethyl acrylate, i-butyl acrylate, and n-butyl acrylate. The polarity of the alkyl acrylate comonomer may be manipulated by changing the relative amount and identity of the alkyl group present in the comonomer. Similarly, a $C_1$-$C_6$ alkyl methacrylate comonomer may be used as a comonomer. Such comonomers include methyl methacrylate, ethyl methacrylate, i-butyl methacrylate, and n-butyl methacrylate.

The ethylene/alkyl acrylate copolymers and ethylene/alkyl methacrylate copolymers useful herein may have melt flow rates ranging from about 0.1 to about 200 g/10 minutes, as determined in accordance with ASTM D1238 at 190° C. and 2.16 kg, and therefore suitable ethylene/alkyl acrylate copolymers and ethylene/alkyl methacrylate copolymers can vary significantly in molecular weight.

It is understood that the ethylene copolymer B used in the blend composition may be in the form of a single ethylene/alkyl acrylate copolymer, a single alkyl methacrylate copolymer, or a mixture of any two or more different ethylene/alkyl acrylate copolymers and/or ethylene alkyl methacrylate copolymers. Blends of at least one ethylene/alkyl acrylate copolymer and at least one ethylene/alkyl methacrylate copolymer are also contemplated as useful in the practice of the invention.

The ethylene/alkyl acrylate copolymers and/or ethylene/alkyl methacrylate copolymers may be prepared by processes well known in the polymer art using either autoclave or tubular reactors. For example, the copolymerization can be conducted as a continuous process in an autoclave, where ethylene, the alkyl acrylate (or alkyl methacrylate), and optionally a solvent such as methanol (see U.S. Pat. No. 5,028,674) are fed continuously into a stirred autoclave such as the type disclosed in U.S. Pat. No. 2,897,183, together with an initiator. In a further embodiment, the ethylene/alkyl acrylate copolymer (or ethylene/alkyl methacrylate copolymer) may be prepared in a tubular reactor, according to the procedure described in the article "High Flexibility EMA Made from High Pressure Tubular Process" (Annual Technical Conference—Society of Plastics Engineers (2002), 60th (Vol. 2), 1832-1836). In a yet further embodiment, the ethylene/alkyl acrylate copolymer (or ethylene/alkyl methacrylate copolymer) may be obtained in a high pressure, tubular reactor at elevated temperature with additional introduction of reactant comonomer along the tube. In a yet further embodiment, the ethylene/alkyl acrylate copolymer or ethylene/alkyl methacrylate copolymer may be produced in a series of autoclave reactors wherein comonomer replacement is achieved by multiple zone introduction of reactant comonomer as taught in U.S. Pat. Nos. 3,350,372; 3,756,996; and 5,532,066.

Ethylene/alkyl acrylate copolymers useful herein include those available from DuPont under the tradename Elvaloy® AC.

The blend composition used herein may further comprise one or more other polyolefins, such as, for example, ethylene homopolymers, propylene homopolymers, additional ethylene copolymers (other than ethylene copolymer A and B), and propylene copolymers. Such optional polyolefin(s) may be present in an amount of up to about 25 wt %, based on the total weight of the blend composition, provided that the inclusion of such optional polyolefin(s) does not adversely affect the desirable performance characteristics of the blend composition, such as the transparency and adhesion properties.

The blend compositions used herein may also contain other additives known within the art. The additives may include, but are not limited to, processing aids, flow enhancing additives, lubricants, pigments, dyes, flame retardants, impact modifiers, nucleating agents, anti-blocking agents such as silica, thermal stabilizers, UV absorbers, UV stabilizers, dispersants, surfactants, chelating agents, coupling agents, reinforcement additives, such as glass fiber, fillers and the like. Generally, additives that may reduce the optical clarity of the blend composition, such as reinforcement additives and fillers, are reserved for those sheets that are used as the back encapsulants in solar cell modules.

Thermal stabilizers can be used and have been widely disclosed within the art. Any known thermal stabilizer may find utility within the compositions useful in the invention. Preferable general classes of thermal stabilizers include, but are not limited to, phenolic antioxidants, alkylated monophenols, alkylthiomethylphenols, hydroquinones, alkylated hydroquinones, tocopherols, hydroxylated thiodiphenyl ethers, alkylidenebisphenols, O-, N- and S-benzyl compounds, hydroxybenzylated malonates, aromatic hydroxybenzyl compounds, triazine compounds, aminic antioxidants, aryl amines, diaryl amines, polyaryl amines, acylaminophenols, oxamides, metal deactivators, phosphites, phosphonites, benzylphosphonates, ascorbic acid (vitamin C), compounds that destroy peroxide, hydroxylamines, nitrones, thiosynergists, benzofuranones, indolinones, and the like and mixtures thereof. The blend composition may contain any effective amount of thermal stabilizers. Use of a thermal stabilizer is optional and in some instances is not preferred. When thermal stabilizers are used, the blend composition contains at least about 0.05 wt %, and up to about 10 wt %, more preferably up to about 5 wt %, and most preferably up to about 1 wt %, of thermal stabilizers, based on the total weight of the blend composition.

UV absorbers can be used and have also been widely disclosed within the art. Any known UV absorber may find utility within the present invention. Preferable general classes of UV absorbers include, but are not limited to, benzotriazoles, hydroxybenzophenones, hydroxyphenyl triazines, esters of substituted and unsubstituted benzoic acids, and the like and mixtures thereof. The blend composition may contain any effective amount of UV absorbers. Use of a UV absorber is optional and in some instances is not preferred. When UV absorbers are utilized, the blend composition contains at least about 0.05 wt %, and up to about 10 wt %, more preferably up to about 5 wt %, and most preferably up to about 1 wt %, of UV absorbers, based on the total weight of the blend composition.

Hindered amine light stabilizers (HALS) can be used and have also been widely disclosed within the art. Generally, hindered amine light stabilizers are disclosed to be secondary, tertiary, acetylated, N-hydrocarbyloxy substituted, hydroxy substituted, or other substituted cyclic amines which are characterized by a substantial amount of steric hindrance, generally derived from aliphatic substitution on the carbon atoms adjacent to the amine function. The blend composition may contain any effective amount of hindered amine light stabilizers. Use of hindered amine light stabilizers is optional and in some instances is not preferred. When hindered amine light stabilizers are used, the blend composition contains at least about 0.05 wt %, and up to about 10 wt %, more preferably up to about 5 wt %, and most preferably, up to about 1 wt %, of hindered amine light stabilizers, based on the total weight of the blend composition.

Silane coupling agents may be added to the blend composition to improve its adhesive strength. Exemplary silane coupling agents that are useful in the compositions of the invention include, but are not limited to, γ-chloropropylmethoxysilane, vinyltrimethoxysilane, vinyltriethoxysilane, vinyltris(β-methoxyethoxy)silane, γ-vinylbenzylpropyltrimethoxysilane, N-β-(N-vinylbenzylaminoethyl)-γ-aminopropyltrimethoxysilane, γ-methacryloxypropyltrimethoxysilane, vinyltriacetoxysilane, γ-glycidoxypropyltrimethoxysilane, γ-glycidoxypropyltriethoxysilane, β-(3,4-epoxycyclohexyl)ethyltrimethoxysilane, vinyltrichlorosilane, γ-mercaptopropylmethoxysilane, γ-aminopropyltriethoxysilane, N-β-(aminoethyl)-γ-aminopropyltrimethoxysilane, and mixtures of two or more thereof. The silane coupling agents are preferably incorporated in the blend composition at a level of about 0.01 to about 5 wt %, or more preferably about 0.05 to about 1 wt %, based on the total weight of the blend composition.

Exemplary blend compositions of ethylene copolymers used herein include, but are not limited to, those disclosed in U.S. Patent Publication Nos. 2006/0160952 and 2006/0148988.

The encapsulant sheet used in the solar cell module may be in a single layer or multilayer form. By "single layer", it is meant that the sheet is made of or consists essentially of the blend composition of ethylene copolymers disclosed herein and described above. When in a multilayer form, it comprises sub-layers and at least one of the sub-layers is made of or consists essentially of the blend composition of ethylene copolymers, while the other sub-layer(s) may be made of or consist essentially of any other suitable polymeric material (s), such as, for example, copolymers of α-olefins and α,β-ethylenically unsaturated carboxylic acids (i.e., acid copolymers), partially neutralized ionic acid copolymers (i.e., ionomers), ethylene/vinyl acetate copolymers, poly(vinyl acetals) (including acoustic grade poly(vinyl acetals)), polyurethanes, polyvinylchlorides, polyethylenes (e.g., linear low density polyethylenes), polyolefin block copolymer elastomers, copolymers of α-olefins and α,β-ethylenically unsaturated carboxylic acid esters (e.g., ethylene methyl acrylate copolymers and ethylene butyl acrylate copolymers), silicone elastomers, epoxy resins, and combinations of two or more thereof.

The encapsulant sheet comprising the blend composition of ethylene copolymers may have a smooth or rough surface on one or both sides. Preferably, the sheet has rough surfaces on both sides to facilitate deaeration during the lamination process. Rough surfaces can be created by mechanically embossing or by melt fracture during extrusion of the sheets followed by quenching so that surface roughness is retained during handling. The surface pattern can be applied to the sheet through well-known, common art processes. For example, the extruded sheet may be passed over a specially prepared surface of a die roll positioned in close proximity to the exit of the extruder die. This imparts the desired surface characteristics to one side of the molten polymer exiting the die. Thus, when the surface of such a die roll has minute peaks and valleys, it will impart a rough surface to the side of the polymer sheet that passes over the roll, and the rough surface will generally conform respectively to the valleys and peaks of the roll surface. Such die rolls are disclosed in, e.g., U.S. Pat. No. 4,035,549 and U.S. Patent Publication No. 2003/0124296.

The encapsulant sheets comprising the blend composition of ethylene copolymers may be produced by any suitable process. For example, the sheets may be formed through dipcoating, solution casting, compression molding, injection molding, lamination, melt extrusion casting, blown film processes, extrusion coating, tandem extrusion coating, or by any other procedures that are known to those of skill in the art. Or, the sheets may be formed by melt extrusion casting, melt coextrusion casting, melt extrusion coating, blown film processes, or tandem melt extrusion coating processes.

If desired, one or both surfaces of any of the component layers comprised in the solar cell modules may be treated prior to the lamination process to enhance the adhesion to other laminate layers. This adhesion enhancing treatment may take any form known within the art and includes flame treatments (see, e.g., U.S. Pat. Nos. 2,632,921; 2,648,097; 2,683,894; and 2,704,382), plasma treatments (see e.g., U.S. Pat. No. 4,732,814), electron beam treatments, oxidation treatments, corona discharge treatments, chemical treatments, chromic acid treatments, hot air treatments, ozone treatments, ultraviolet light treatments, sand blast treatments, solvent treatments, and combinations of two or more thereof. Also, the adhesion strength may be further improved by further applying an adhesive or primer coating on the surface of the laminate layer(s). For example, U.S. Pat. No. 4,865,711 discloses a film or sheet with improved bondability, which has a thin layer of carbon deposited on one or both surfaces. Other exemplary adhesives or primers may include silanes, poly (allyl amine) based primers (see e.g., U.S. Pat. Nos. 5,411,845; 5,770,312; 5,690,994; and 5,698,329), and acrylic based primers (see e.g., U.S. Pat. No. 5,415,942). The adhesive or primer coating may take the form of a monolayer of the adhesive or primer and have a thickness of about 0.0004 to about 1 mil (about 0.00001 to about 0.03 mm), or preferably, about 0.004 to about 0.5 mil (about 0.0001 to about 0.013 mm), or more preferably, about 0.004 to about 0.1 mil (about 0.0001 to about 0.003 mm).

The term "solar cell" is meant to include any article which can convert light into electrical energy. Solar cells useful in the invention include, but are not limited to, wafer-based solar cells (e.g., c-Si or mc-Si based solar cells, as described above in the background section) and thin film solar cells (e.g., a-Si, μc-Si, CdTe, CIS, CIGS, light absorbing dyes, or organic semiconductor based solar cells, as described above in the background section). Within the solar cell layer, it is preferred that the solar cells are electrically interconnected and/or arranged in a flat plane. In addition, the solar cell layer may further comprise electrical wirings, such as cross ribbons and bus bars.

The solar cell layer may be bifacial. In such an embodiment, all the laminating materials positioned on either side of the solar cell layer should be sufficiently transparent to allow sunlight or reflected sunlight to reach the solar cells. Or, the solar cell layer may have a sun-facing side (which is also referred to as a front side and, when in actual use conditions, would generally face toward the sun) and a non-sun-facing side (which is also referred to as a back side and, when in actual use conditions, would generally face away from the sun). In such an embodiment, all the materials that are present in the laminate layers and sub-layers positioned to the sun-facing side of the solar cell layer should have sufficient transparency to allow the sunlight to reach the solar cells. The laminating materials present in the laminate layers and sub-layers positioned to the non-sun-facing side of the solar cell layer need not be transparent.

The solar cell module typically comprises at least one layer of an encapsulant sheet comprising the blend composition, which is laminated to the solar cell layer. By "laminated", it is meant that, within a laminated structure, the two layers are bonded either directly (i.e., without any additional material between the two layers) or indirectly (i.e., with additional material, such as interlayer or adhesive materials, between the two layers). In certain embodiments, the encapsulant sheet layer comprising the blend composition is directly bonded to the solar cell layer.

The solar cell module may further comprise additional encapsulant layers comprising other polymeric materials, such as acid copolymers, ionomers of acid copolymers, ethylene/vinyl acetate copolymers, poly(vinyl acetals) (including acoustic grade poly(vinyl acetals)), polyurethanes, poly (vinyl chlorides), polyethylenes (e.g., linear low density polyethylenes), polyolefin block elastomers, copolymers of α-olefins and α,β-ethylenically unsaturated carboxylic acid esters) (e.g., ethylene methyl acrylate copolymers and ethylene butyl acrylate copolymers), silicone elastomers, epoxy resins, and combinations of two or more thereof.

The thickness of each of the encapsulant layers comprising the blend compositions of ethylene copolymers or of the other polymeric encapsulant layers may independently range from about 1 to about 120 mils (about 0.025 to about 3 mm), or about 10 to about 90 mils (about 0.25 to about 2.3 mm), or about 15 to about 60 mils (about 0.38 to about 1.5 mm), or about 20 to about 60 mils (about 0.51 to about 1.5 mm), or about 20 to about 45 mils (about 0.51 to about 1.14 mm). Any or all of the encapsulant layer(s) comprised in the solar cell modules may have smooth or rough surfaces. Preferably, the encapsulant layer(s) have rough surfaces to facilitate deaeration during the lamination process.

In certain embodiments, the encapsulant layer comprising the blend composition of ethylene copolymers is in the form of a bi-layer sheet having a first sub-layer that consists essentially of the blend composition and a second sub-layer that comprises any suitable encapsulant material, as disclosed above. In such an embodiment, the sub-layer comprising the blend composition may have a thickness of about 0.5 to about 15 mils (about 13 to about 381 μm).

In a further embodiment, the encapsulant layer comprising the ethylene copolymer composition is in the form of a tri-layer sheet having two surface sub-layers and one inner sub-layer, wherein each of the two surface sub-layers consists essentially of the blend composition and the inner sub-layer comprises any suitable encapsulant material as disclosed above. Further, each of the surface sub-layers, which consist essentially of the blend composition, may have a thickness of about 0.5 to about 15 mils (about 13 to about 381 μm).

The solar cell module may further comprise an incident layer and/or a backing layer serving as the outermost layer or layers of the module at the sun-facing side and the non-sun-facing side of the solar cell module, respectively.

The outer layers of the solar cell modules, i.e., the incident layer and the backing layer, may comprise any suitable sheets or films. Suitable sheets may be glass or plastic sheets. Plastic sheets may comprise polymers such as polycarbonates, acrylics, polyacrylates, cyclic polyolefins (e.g., ethylene norbornene polymers), polystyrenes (preferably polystyrenes prepared in the presence of metallocene catalysts), polyamides, polyesters, fluoropolymers, or combinations of two or more thereof. In addition, metal sheets, such as aluminum, steel, galvanized steel, or ceramic plates may be utilized in forming the backing layer.

The term "glass" includes not only window glass, plate glass, silicate glass, sheet glass, low iron glass, tempered glass, tempered CeO-free glass, and float glass, but also colored glass, specialty glass (such as those containing ingredients to control solar heating), coated glass (such as those sputtered with metals (e.g., silver or indium tin oxide) for solar control purposes), low E-glass, Toroglas® glass (Saint-Gobain N.A. Inc., Trumbauersville, Pa.), Solexia™ glass (PPG Industries, Pittsburgh, Pa.) and Starphire® glass (PPG Industries). Such specialty glasses are disclosed in, e.g., U.S. Pat. Nos. 4,615,989; 5,173,212; 5,264,286; 6,150,028; 6,340, 646; 6,461,736; and 6,468,934. It is understood, however, that the type of glass to be selected for a particular module depends on the intended use.

Suitable film layers comprise polymers that include but are not limited to, polyesters (e.g., poly(ethylene terephthalate) and poly(ethylene naphthalate)), polycarbonate, polyolefins (e.g., polypropylene, polyethylene, and cyclic polyolefins), norbornene polymers, polystyrene (e.g., syndiotactic polystyrene), styrene-acrylate copolymers, acrylonitrile-styrene copolymers, polysulfones (e.g., polyethersulfone, polysulfone, etc.), nylons, poly(urethanes), acrylics, cellulose acetates (e.g., cellulose acetate, cellulose triacetates, etc.), cellophane, silicones, poly(vinyl chlorides) (e.g., poly(vinylidene chloride)), fluoropolymers (e.g., polyvinyl fluoride, polyvinylidene fluoride, polytetrafluoroethylene, and ethylene-tetrafluoroethylene copolymers.), and combinations of two or more thereof. The polymeric film may be non-oriented, or uniaxially oriented, or biaxially oriented. Some specific exemplary films that may be used in the solar cell module outer layers (e.g., the incident layer or the backing layer) include, but are not limited to, polyester films (e.g., poly(ethylene terephthalate) (PET) films), fluoropolymer films (e.g., Tedlar®, Tefzel®, and Teflon® films available from DuPont). Metal films, such as aluminum foil, may also be used as the backing layers. Further the films used in the solar cell module outer layers may be in the form of multilayer films, such a fluoropolymer/polyester/fluoropolymer multilayer film (e.g., Tedlar®/PET/Tedlar® or TPT laminate film available from Isovolta AG., Austria or Madico, Woburn, Mass.).

The solar cell module may further comprise other functional film or sheet layers (e.g., dielectric layers or barrier layers) embedded within the module. Such functional layers may comprise any of the above mentioned polymeric films or those that are coated with additional functional coatings. For example, poly(ethylene terephthalate) films coated with a metal oxide coating, such as those disclosed within U.S. Pat. Nos. 6,521,825 and 6,818,819 and European Patent No. EP1182710, may function as oxygen and moisture barrier layers in the laminates.

If desired, a layer of nonwoven glass fiber (scrim) may also be included between the solar cell layers and the encapsulant layers to facilitate deaeration during the lamination process and/or to serve as reinforcement for the encapsulants. The use of such scrim layers is disclosed within, e.g., U.S. Pat. Nos. 5,583,057; 6,075,202; 6,204,443; 6,320,115; and 6,323,416 and European Patent No. EP0769818.

A special film or sheet may be included to serve both the function of an encapsulant layer and an outer layer. It is also conceivable that any of the film or sheet layers included in the module may be in the form of a pre-formed single-layer or multilayer film or sheet.

If desired, one or both surfaces of the incident layer films and sheets, the backing layer films and sheets, the encapsulant layers and other layers incorporated within the solar cell module may undergo any suitable adhesion enhancing treatment. This adhesion enhancing treatment may take any form known within the art and includes flame treatments (see, e.g., U.S. Pat. Nos. 2,632,921; 2,648,097; 2,683,894; and 2,704, 382), plasma treatments (see e.g., U.S. Pat. No. 4,732,814), electron beam treatments, oxidation treatments, corona discharge treatments, chemical treatments, chromic acid treatments, hot air treatments, ozone treatments, ultraviolet light treatments, sand blast treatments, solvent treatments, and combinations of two or more thereof. Also, the adhesion strength may be further improved by further applying an adhesive or primer coating on the surface of the laminate layer(s). For example, U.S. Pat. No. 4,865,711 discloses a film or sheet with improved bondability, which has a thin layer of carbon deposited on one or both surfaces. Other exemplary adhesives or primers may include silanes, poly (allyl amine) based primers (see e.g., U.S. Pat. Nos. 5,411, 845; 5,770,312; 5,690,994; and 5,698,329), and acrylic based primers (see e.g., U.S. Pat. No. 5,415,942). The adhesive or primer coating may take the form of a monolayer of the adhesive or primer and have a thickness of about 0.0004 to about 1 mil (about 0.00001 to about 0.03 mm), or preferably, about 0.004 to about 0.5 mil (about 0.0001 to about 0.013 mm), or more preferably, about 0.004 to about 0.1 mil (about 0.0001 to about 0.003 mm).

Figure 1:
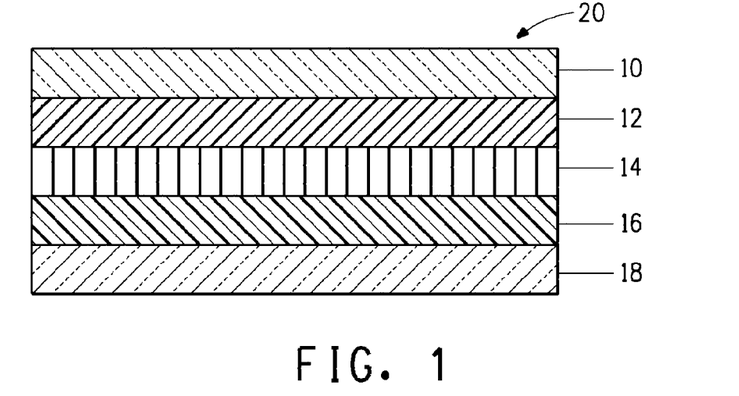
FIG. 1 is a cross-sectional view, not-to-scale, of a wafer-based solar cell module disclosed herein.

In one particular embodiment (now referring to FIG. 1), where the solar cells are derived from wafer-based self supporting solar cell units, the solar cell module (20) may comprise, in order of position from the front sun-facing side to the back non-sun-facing side, (a) an incident layer (10), (b) a front encapsulant layer (12), (c) a solar cell layer (14) comprised of one or more electrically interconnected solar cells, (d) a back encapsulant layer (16), and (e) a backing layer (18), wherein at least one or both of the front and back encapsulant layers (12 and 16) is formed of the sheet comprising the blend composition.

Figure 2:
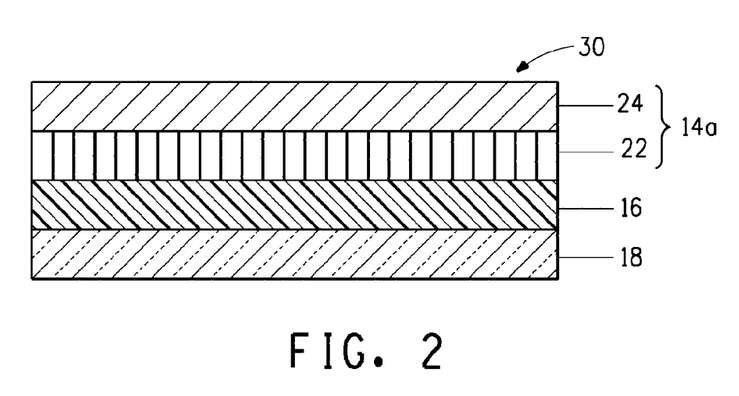
FIG. 2 is a cross-sectional view, not-to-scale, of one particular thin film solar cell module disclosed herein.
Figure 3:
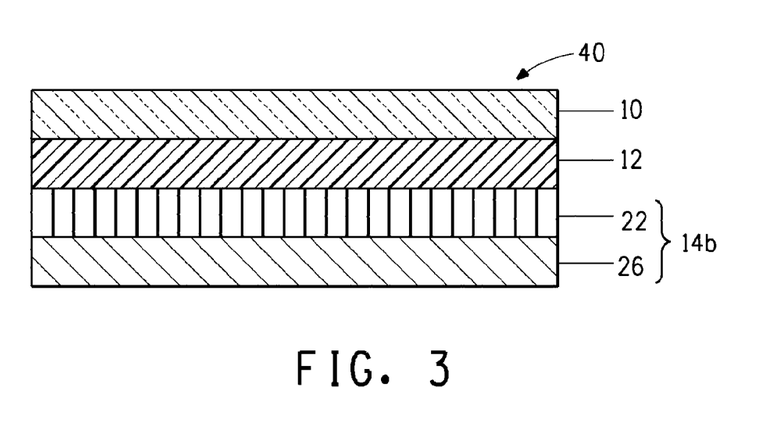
FIG. 3 is a cross-sectional view, not-to-scale, of another thin film solar cell module disclosed herein.

In a further embodiment, the solar cell modules are derived from thin film solar cells and may (i) in one embodiment (30 in FIG. 2), comprise, in order of position from the front sun-facing side to the back non-sun-facing side, (a) a solar cell layer (14a) comprising a superstrate (24) and a layer of thin film solar cell(s) (22) deposited thereon at the non-sun-facing side, (b) a (back) encapsulant layer (16) formed of the sheet comprising the blend composition, and (c) a backing layer (18) or (ii) in another embodiment (40 in FIG. 3), comprise, (a) a transparent incident layer (10), (b) a (front) encapsulant layer (12) formed of the sheet comprising the blend composition, and (c) a solar cell layer (14b) comprising a layer of thin film solar cell(s) (22) deposited on a substrate (26) at the sun-facing side thereof.

Moreover, a series of the solar cell modules described above may be further linked to form a solar cell array, which can produce a desired voltage and current.

Any lamination process known within the art (such as an autoclave or a non-autoclave process) may be used to prepare the solar cell modules.

In an exemplary process, the component layers of the solar cell module are stacked in the desired order to form a pre-lamination assembly. The assembly is then placed into a bag capable of sustaining a vacuum ("a vacuum bag"), the air is drawn out of the bag by a vacuum line or other means, the bag is sealed while the vacuum is maintained (e.g., at least about 27-28 in. Hg (689-711 mm Hg)), and the sealed bag is placed in an autoclave and the pressure is raised to about 150 to about 250 psi (about 11.3 to about 18.8 bar), and a temperature of about 130° C. to about 180° C., or about 120° C. to about 160° C., or about 135° C. to about 155° C., or about 145° C. to about 155° C., for about 10 to about 50 min, or about 20 to about 45 min, or about 20 to about 40 min, or about 25 to about 35 min. A vacuum ring may be substituted for the vacuum bag. One type of suitable vacuum bag is disclosed within U.S. Pat. No. 3,311,517. Following the heat and pressure cycle, the air in the autoclave is cooled without adding additional air to maintain pressure in the autoclave. After about 20 min of cooling, the excess air pressure is vented and the laminates are removed from the autoclave.

Alternatively, the pre-lamination assembly may be heated in an oven at about 80° C. to about 120° C., or about 90° C. to about 100° C., for about 20 to about 40 min, and thereafter, the heated assembly is passed through a set of nip rolls so that the air in the void spaces between the individual layers may be squeezed out, and the edge of the assembly sealed. The assembly at this stage is referred to as a pre-press.

The pre-press may then be placed in an air autoclave where the temperature is raised to about 120° C. to about 160° C., or about 135° C. to about 160° C., at a pressure of about 100 to about 300 psi (about 6.9 to about 20.7 bar), or preferably about 200 psi (13.8 bar). These conditions are maintained for about 15 to about 60 min, or about 20 to about 50 min, after which the air is cooled while no further air is introduced to the autoclave. After about 20 to about 40 min of cooling, the excess air pressure is vented and the laminated products are removed from the autoclave.

The solar cell modules may also be produced through non-autoclave processes. Such non-autoclave processes are disclosed, e.g., in U.S. Pat. Nos. 3,234,062; 3,852,136; 4,341,576; 4,385,951; 4,398,979; 5,536,347; 5,853,516; 6,342,116; and 5,415,909, U.S. Patent Publication No. 2004/0182493, European Patent No. EP1235683 B1, and PCT Patent Publication Nos. WO91/01880 and WO03/057478. Generally, the non-autoclave processes include heating the pre-lamination assembly and the application of vacuum, pressure or both. For example, the assembly may be successively passed through heating ovens and nip rolls.

These examples of lamination processes are not intended to be limiting. Essentially any lamination process may be used.

If desired, the edges of the solar cell module may be sealed to reduce moisture and air intrusion that lead to potential reduction of the efficiency and lifetime of the solar cell(s). The edges may be sealed by any means disclosed within the art. Suitable edge seal materials include, but are not limited to, butyl rubber, polysulfide, silicone, polyurethane, polypropylene elastomers, polystyrene elastomers, block elastomers (such as styrene-ethylene-butylene-styrene (SEBS)), and the like.

The invention is further illustrated by the following examples of certain embodiments.

EXAMPLES

The following polymer materials were used in the examples:

EMA-1—an ethylene/methyl acrylate copolymer comprising 20 wt % of copolymerized units of methyl acrylate, based on the total weight of the copolymer, and having a melt flow rate of 8 g/10 min, as determined in accordance with ASTM D1238 at 190° C. and 2.16 kg;

EMA-2—an ethylene/n-butyl acrylate copolymer comprising 27 wt % of copolymerized units of n-butyl acrylate, based on the total weight of the copolymer, and having a melt flow rate of 4 g/10 min, as determined in accordance with ASTM D1238 at 190° C. and 2.16 kg;

EMA-3—an ethylene/methyl acrylate copolymer comprising 24 wt % of copolymerized units of methyl acrylate, based on the total weight of the copolymer, and having a melt flow rate of 2 g/10 min, as determined in accordance with ASTM D1238 at 190° C. and 2.16 kg.

E/MAME-1—an ethylene/monoethyl maleate copolymer comprising 9.5 wt % of copolymerized units of the monoethyl ester of maleic acid, based on the total weight of the copolymer, and having a melt flow rate of 30 g/10 min, as determined in accordance with ASTM D1238 at 190° C. and 2.16 kg;

E/MAME-2—an ethylene/monoethyl maleate copolymer comprising 15 wt % of copolymerized units of the monoethyl ester of maleic acid, based on the total weight of the copolymer, and having a melt flow rate of 30 g/10 min, as determined in accordance with ASTM D1238 at 190° C. and 2.16 kg;

EVA-1—an ethylene/vinyl acetate copolymer comprising 28 wt % of copolymerized units of vinyl acetate, based on the total weight of the copolymer, and having a melt flow rate of 2 g/10 min, as determined in accordance with ASTM D1238 at 190° C. and 2.16 kg;

EVA-2—an ethylene/vinyl acetate copolymer comprising 25 wt % of copolymerized units of vinyl acetate, based on the total weight of the copolymer, and having a melt flow rate of 2 g/10 min, as determined in accordance with ASTM D1238 at 190° C. and 2.16 kg;

ECP-1—a blend of EMA-1 (80 wt %) and E/MAME-1 (20 wt %), which has a melt flow rate of 10 g/10 min, as determined in accordance with ASTM D1238 at 190° C. and 2.16 kg, and was prepared by melt blending using a 30 mm diameter twin screw extruder with a mixing screw at a melt temperature of 180° C. to 230° C.;

ECP-2—a blend of EMA-2 (80 wt %) and E/MAME-2 (20 wt %), which has a melt flow rate of 4.5 g/10 min, as determined in accordance with ASTM D1238 at 190° C. and 2.16 kg, and was prepared by melt blending using a 30 mm diameter twin screw extruder with a mixing screw at a melt temperature of 180° C. to 230° C.;

ECP-3—a blend of EVA-1 (80 wt %) and E/MAME-2 (20 wt %), which has a melt flow rate of 3.2 g/10 min, as determined in accordance with ASTM D1238 at 190° C. and 2.16 kg, and was prepared by melt blending using a 30 mm diameter twin screw extruder with a mixing screw and at a melt temperature of 180° C. to 230° C.;

ECP-4—a blend of EMA-1 (80 wt %) and E/MAME-2 (20 wt %), which has a melt flow rate of 7.7 g/10 min, as determined in accordance with ASTM D1238 at 190° C. and 2.16 kg, and was prepared by melt blending using a 30 mm diameter twin screw extruder with a mixing screw at a melt temperature of 180° C. to 230° C.;

ECP-5—a blend of EMA-3 (80 wt %) and E/MAME-2 (20 wt %), which has a melt flow rate of 2.9 g/10 min, as determined in accordance with ASTM D1238 at 190° C. and 2.16 kg, and was prepared by melt blending using a 30 mm diameter twin screw extruder with a mixing screw at a melt temperature of 180° C. to 230° C.;

ECP-6—a blend of EMA-2 (80 wt %) and E/MAME-1 (20 wt %), which has a melt flow rate of 4.8 g/10 min, as determined in accordance with ASTM D1238 at 190° C. and 2.16 kg, and was prepared by melt blending using a 30 mm diameter twin screw extruder with a mixing screw at a melt temperature of 180° C. to 230° C.;

EAA-1—an ethylene/acrylic acid copolymer comprising 18 wt % of copolymerized units of the acrylic acid, based on the total weight of the copolymer, and having a melt flow rate of about 60 g/10 min, as determined in accordance with ASTM D1238 at 190° C. and 2.16 kg;

EMAA-1—an ethylene/methacrylic acid copolymer comprising 12 wt % of copolymerized units of methacrylic acid, based on the total weight of the copolymer, and having a melt flow rate of 13.5 g/10 min, as determined in accordance with ASTM D1238 at 190° C. and 2.16 kg;

EMA/EAA blend—a blend of EMA-1 (80 wt %) and EAA-1 (20 wt %), prepared by melt blending using a 30 mm diameter twin screw extruder with a mixing screw at a melt temperature of 180° C. to 230° C.;

Each of the polymer materials listed above was formed into a press molded film or a cast film. In particular, the press molded films were prepared using press molds set at a temperature of 180° C.-210° C., while the cast films were prepared by feeding the polymer resin into a twin screw extruder (with a diameter of 28 mm and a length to diameter ratio of (L/D) of 28:1) that was operated with ramped extruder zone temperatures of 160° C. to 180° C., passing the polymer melt through a 10 in (25.4 cm) wide slot die that was operated at a temperature of 180° C., and casting the polymer melt onto a casting roll that was chilled to 20° C.

Examples E1-E9 and Comparative Examples CE1-CE8

In Examples E1-E9 and Comparative Examples CE1-CE8, each film was laminated between a sheet of glass and a Tedlar®/polyethylene terephthalate (PET)/Tedlar® tri-layer film ("TPT"), thereby forming a glass laminate with the structure of glass/interlayer/TPT. The glass sheets used were ⅛ in (3.2 mm) thick Krystal Klear® glass (AGC Flat Glass North America, Inc. Alpharetta, Ga.) having a size of 4×4 inch (10×10 cm). The TPT tri-layer films used were formed of a polyester film sandwiched between two Tedlar® films from DuPont. Each of the glass laminates was prepared in accordance with the lamination process outlined below.

Specifically, in forming each of the laminates listed in Table 1 (CE1-CE8 and E1-E3), the compression molded interlayer film (1×4 in (2.5×10 cm)) was positioned between a TPT film (1×9 in (2.5×23 cm)) and a glass sheet with the "Tin Side" of the glass sheet facing the interlayer film. Such a pre-lamination assembly was then placed into a Meier ICO-LAM 10/08 laminator (Meier Vakuumtechnik GmbH, Bocholt, Germany) and laminated. The lamination cycle included an evacuation step (vacuum of 3 in Hg (76 mm Hg)) of 3-5 minutes and a pressing step at a pressure of one atmosphere (101,325 Pa) for 0.5-5 minutes at the laminator temperature setting of 140° C.

In forming each of the laminates listed in Table 2 (E4-E9), a 5 mil (0.13 mm) thick Teflon® fluorinated ethylene propylene (FEP) film (DuPont) (½×4 in (1.3×10 cm)) was placed on the top of a glass sheet (4×4 in (10×10 cm)) in a position that the long edge of the FEP film strip was aligned with one edge of the glass sheet to serve as the open space for conducting further peel adhesion testing. The cast interlayer film (4×9 in (10×23 cm)) was then placed onto the glass sheet covering the glass and the FEP film and extending 5 in (13 cm) past the edge along which the FEP film and the glass sheet were aligned. Finally, a TPT film (4×9 in (10×23 cm)) was placed over the interlayer film with the polished (or reflective) side down and facing the interlayer film. Such pre-lamination assemblies were then laminated as disclosed above. Finally, the FEP film strip was removed, along its 9 in (23 cm) length, the interlayer/TPT film was cut into three 1-inch (2.5-mm) wide strips, and then using a sharp edged, flat bladed razor knife the bond between the interlayer film and the glass was separated to a depth of about ¼ in (33 mm) from the edge where the FEP film had been placed.

Using an Instron tester (Instron Tensile Tester Model 1122) the interlayer/TPT film layers were peeled away from the glass sheet at a 180° angle and a 12.7 cm/min rate, before and/or after a 24-hour or 91-hour immersion of the laminate in water at ambient temperature. The peel load for each sample is shown in Tables 1 and 2.

As shown in Table 1, interlayers made of EMA-1 (CE1) exhibited virtually no adhesion to glass, while interlayers made of EVA-1 or EVA-2 (CE4 or CE5) exhibited little adhesion to glass. Interlayers made of E/MAME-1 or E/MAME-2 (CE2 or CE3) provided good adhesion to glass when the lamination condition was set with a 5-minute evacuation and a 3-minute press.

In comparison, as shown by E1-E9, all interlayers made of blends of E/MAME AND EMA OR EVA except two samples provided good adhesion to glass before and after water treatment. The two sample laminates, where the interlayers failed to provide good adhesion after the 24-hour water treatment, were prepared under lamination conditions with a 3-minute evacuation and a 0.5-minute press.

Further, interlayers made of EAA-1 or EMAA-1 (CE6 or CE7) provided good adhesion to glass prior to the water treatment, but not following the water treatment. The results further show that the adhesion to glass for those interlayers made of EMA/EAA Blend (CE8, EMA-1 and EAA-1 blend) was higher than that for those interlayers made of EMA-1 (CE1) but lower than that for those interlayers made of EAA-1 (CE6). This is expected for a blend sample which generally exhibits the average properties of both components.

TABLE 1

| Examples | Interlayer Material | Evacuation Time (min) | Pressing Time (min) | Water Treatment[e] | 180° Peel Load (lbs/in) |
|---|---|---|---|---|---|
| CE1 | EMA-1 | 3 | 2 | NO | 0 |
|  |  | 5 | 1.5 | NO | 0.01 |
|  |  | 5 | 3 | NO | 0.14[a] |
|  |  | 3 | 2 | YES | 0 |
|  |  | 5 | 1.5 | YES | 0 |
|  |  | 5 | 3 | YES | 0 |
| CE2 | E/MAME-1 | 3 | 2 | NO | 2.42[b] |
|  |  | 5 | 1.5 | NO | 2.3[a] |
|  |  | 5 | 3 | NO | 16.91 |
|  |  | 3 | 2 | YES | 0.23 |
|  |  | 5 | 1.5 | YES | 10.73 |
|  |  | 5 | 3 | YES | 1.7 |
| CE3 | E/MAME-2 | 3 | 2 | NO | 1.58[a] |
|  |  | 5 | 1.5 | NO | 0.71[a] |
|  |  | 5 | 3 | NO | 15.44 |
|  |  | 3 | 2 | YES | 0 |
|  |  | 5 | 1.5 | YES | 0 |
|  |  | 5 | 3 | YES | 0 |
| CE4 | EVA-1 | 3 | 5 | NO | 0.13 |
|  |  | 3 | 5 | YES | 0 |
| CE5 | EVA-2 | 3 | 5 | NO | 0.11 |
|  |  | 3 | 5 | YES | 0 |
| E1 | ECP-1 | 3 | 0.5 | NO | 14.66[a] |
|  |  | 3 | 2 | NO | 24.33[a] |
|  |  | 3 | 2 | NO | 21.89[c] |
|  |  | 3 | 5 | NO | 14.07 |
|  |  | 5 | 0.5 | NO | 11.93 |
|  |  | 5 | 1.5 | NO | 22.83 |
|  |  | 5 | 2 | NO | 27.94 |
|  |  | 5 | 3 | NO | 22.42 |
|  |  | 3 | 0.5 | YES | 1.8 |
|  |  | 3 | 2 | YES | 14.53 (2) |
|  |  | 3 | 2 | YES | 13.25[c] |

TABLE 1-continued

| Examples | Interlayer Material | Evacuation Time (min) | Pressing Time (min) | Water Treatment[e] | 180° Peel Load (lbs/in) |
|---|---|---|---|---|---|
| | | 3 | 5 | YES | 19.5 |
| | | 5 | 0.5 | YES | 12.67 |
| | | 5 | 1.5 | YES | 10.63 |
| | | 5 | 2 | YES | 13.83 |
| | | 5 | 3 | YES | 23.23[a] |
| | | 5 | 3 | YES | 39.49[c] |
| E2 | ECP-2 | 3 | 0.5 | NO | 11.2[a] |
| | | 3 | 5 | NO | 40.48 |
| | | 3 | 2 | NO | 27.33[a,c] |
| | | 5 | 0.5 | NO | 12.74 |
| | | 5 | 2 | NO | 15.02 |
| | | 5 | 3 | NO | 33.29 |
| | | 3 | 0.5 | YES | 7.92[a] |
| | | 3 | 2 | YES | 17.65 |
| | | 3 | 2 | YES | 18.14[c] |
| | | 3 | 5 | YES | 47.28 |
| | | 5 | 0.5 | YES | 14.16 |
| | | 5 | 2 | YES | 17.86 |
| | | 5 | 3 | YES | N/A[d] |
| E3 | ECP-3 | 3 | 5 | NO | 29.96[a] |
| | | 3 | 5 | YES | 31.67 |
| | | 5 | 3 | YES | 22.17 |
| CE6 | EAA-1 | 3 | 5 | NO | 21.2 |
| | | 5 | 3 | NO | 13 |
| | | 3 | 5 | YES | 1.5 |
| | | 5 | 3 | YES | 5.6 |
| CE7 | EMAA-1 | 3 | 5 | NO | 32.4 |
| | | 5 | 3 | NO | 36.9 |
| | | 3 | 5 | YES | 6 |
| | | 5 | 3 | YES | 0.6 |
| CE8 | EMA/EAA Blend | 3 | 5 | NO | 7.7 |
| | | 5 | 3 | No | 3 |
| | | 3 | 5 | YES | 3.7 |
| | | 5 | 3 | YES | 4.3[a] |

Note:
[a]Average of two tests;
[b]Average of three tests;
[c]The laminator temperature was set at 150° C. when the laminate was made;
[d]The glass sheet in the laminate was broken.
[e]a 24-hour immersion in water at ambient temperature.

TABLE 2

| Examples | Interlayer Material | Evacuation Time (min) | Pressing Time (min) | Water Treatment[b] | 180° Peel Load (lbs/in) |
|---|---|---|---|---|---|
| E4 | ECP-1 | 3 | 5 | NO | 44.1 |
| | | 3 | 5 | YES | 9.7 |
| E5 | ECP-2 | 3 | 5 | NO | 38.2 |
| | | 3 | 5 | YES | 31.5[a] |
| E6 | ECP-3 | 3 | 5 | NO | 34.6 |
| | | 3 | 5 | YES | 11.2 |
| E7 | ECP-4 | 3 | 5 | NO | 42.9 |
| | | 3 | 5 | YES | 22.6 |
| E8 | ECP-5 | 3 | 5 | NO | 36.3 |
| | | 3 | 5 | YES | 14.5 |
| E9 | ECP-6 | 3 | 5 | NO | 41.4 |
| | | 3 | 5 | YES | 28.3 |

Note:
[a]Average of two tests;
[b]91-hour immersion in water at ambient temperature.

Examples E10-15 and Comparative Examples CE9-CE11

In these examples, solar energy transmittance for cast films made from blends of E/MAME and EMA or EVA (E10-E15), EMA-1 (CE9), EMA-2 (CE10), or E/MAME (CE11) was determined in accordance with ASTM E424. As shown in Table 3, the cast films made from blends of E/MAME and EMA or EVA retain good transmittance.

TABLE 3

| Examples | Adhesive Sample | Cast film Thickness (mil) | Solar Energy Transmittance (%) |
|---|---|---|---|
| E10 | ECP-1 | 18.4 | 90.1 |
| E11 | ECP-2 | 15.4 | 91.2 |
| E12 | ECP-3 | 16.6 | 91.6 |
| E13 | ECP-4 | 15.7 | 90.9 |
| E14 | ECP-5 | 15.6 | 91.2 |
| E15 | ECP-6 | 23.6 | 89.7 |
| CE9 | EMA-1 | 19 | 90.9 |
| CE10 | EMA-2 | 20 | 90.7 |
| CE11 | E/MAME-1 | 10 | 86.8 |

Examples E16 and E17

In E16, a two-layer laminate comprising a 10 mil (0.25 mm) thick press molded film of ECP-1 and a 5 mil (0.051 mm) thick DuPont Kapton® film were made by pressing the two films for 30 seconds at 140° C. under 100 psi (0.689 MPa) in a pre-heated press. Using an Instron tester (Instron Tensile Tester Model 1122) the ECP-1 film was peeled away from the Kapton® film at a 180° angle and a 12.7 cm/min rate, and the peel load was recorded as 4.5 lb/in.

In E17, a two-layer laminate with the same structure of that in E16 was prepared similarly, except that the films were pressed together at 160° C., and the peel load was recorded as 5.2 lb/in.

Examples E18-E37

12×12 in (305×305 mm) solar cell modules described in Table 4 are prepared following either lamination process 1 (E18-E27) or lamination process 2 (E28-E37), as outlined below. Layers 1 and 2 constitute the incident layer and the front encapsulant layer, respectively, and Layers 4 and 5 constitute the back encapsulant layer and the back-sheet, respectively, when applicable.

In lamination process 1, the component layers of the laminate are first stacked to form a pre-lamination assembly. For the assembly containing a polymeric film layer as the outer surface layer, a cover glass sheet is placed over the film layer. The pre-lamination assembly is then placed within a Meier ICOLAM® 10/08 laminator (Meier laminator; Meier Vakuumtechnik GmbH, Bocholt, Germany). The lamination cycle includes an evacuation step (vacuum of 3 in. Hg (76 mm Hg)) of 5.5 min and a pressing stage (pressure of 1000 mbar) of 5.5 min at a temperature of 145° C. The resulting laminate is then removed from the laminator.

In lamination process 2, the pre-lamination assembly is placed within a vacuum bag, which is sealed and a vacuum is applied to remove the air from the vacuum bag. The bag is placed into an oven and heated to a temperature of about 90° C. to about 100° C. for 30 min to remove air contained within the assembly. The assembly is then subjected to autoclaving at 140° C. for 30 min in an air autoclave to a pressure of 200 psig (14.3 bar). The air is cooled without further introducing air to the autoclave. After 20 min of cooling and when the air temperature reaches less than about 50° C., the autoclave is vented and the vacuum bag containing the laminated assembly is removed from the autoclave. The resulting laminate is then removed from the vacuum bag.

TABLE 4

Solar Cell Laminate Structure

| Sample No. | Layer 1 | Layer 2 | Layer 3 | Layer 4 | Layer 5 |
|---|---|---|---|---|---|
| E18, E28 | Glass 1 | ECP-A | Solar Cell 1 | | |
| E19, E29 | Glass 2 | ECP-C | Solar Cell 2 | | |
| E20, E30 | | | Solar Cell 3 | ECP-E | TPT film |
| E21, E31 | Glass 1 | ECP-B | Solar Cell 4 | ION | FPF |
| E22, E32 | | | Solar Cell 5 | ECP-C | Glass 2 |
| E23, E33 | Glass 1 | ECP-F | Solar Cell 4 | ECP-F | Glass 3 |
| E24, E34 | Glass 1 | ECP-E | Solar Cell 1 | | |
| E25, E35 | | | Solar Cell 5 | ECP-A | Glass 2 |
| E26, E36 | | | Solar Cell 5 | ECP-C | Glass 2 |
| E27, E37 | Glass 1 | ECP-D | Solar Cell 4 | ECP-D | TPT film |

ION is a 35 mil (0.89 mm) thick embossed sheet made of an ionomer of a copolymer of ethylene and methacrylic acid containing 21.7 wt % of copolymerized units of methacrylic acid, 30% neutralized with sodium ions, MFR of 0.9 g/10 min (at 190° C., 2.16 kg). The MFR of the precursor ethylene methacrylic acid copolymer, prior to neutralization was 23 g/10 min (at 190° C., 2.16 kg).
FPF is a corona surface treated Tedlar ® film (1.5 mil (0.038 mm) thick) from DuPont.
Glass 1 is Starphire ® glass from the PPG Industries.
Glass 2 is a clear annealed float glass plate layer (2.5 mm thick).
Glass 3 in a Solexia ™ solar control glass (3.0 mm thick) from PPG Industries.
ECP-A is a 35 mil (0.89 mm) thick embossed sheet made from ECP-1.
ECP-B is a 45 mil (1.14 mm) thick embossed sheet made from ECP-1.
ECP-C is a 20 mil (0.51 mm) thick embossed sheet made from ECP-2.
ECP-D is a 60 mil (1.52 mm) thick embossed sheet made from ECP-2.
ECP-E is a 45 mil (1.14 mm) thick embossed sheet made from ECP-3.
ECP-F is a 25 mil (0.64 mm) thick embossed sheet made from ECP-3.
Solar Cell 1 is a 10 × 10 in (254 × 254 mm) a-Si based thin film solar cell with a 125 μm thick stainless steel substrate (U.S. Pat. No. 6,093,581, Example 1).
Solar Cell 2 is a 10 × 10 in (254 × 254 mm) CIS based thin film solar cell (U.S. Pat. No. 6,353,042, column 6, line 19).
Solar Cell 3 is a 10 × 10 in (254 × 254 mm) CdTe based thin film solar cell (U.S. Pat. No. 6,353,042, column 6, line 49).
Solar Cell 4 is a silicon solar cell made from a 10 × 10 in (254 × 254 mm) polycrystalline EFG-grown wafer (U.S. Pat. No. 6,660,930, column 7, line 61).
Solar Cell 5 is a thin film solar cell supported on 12 × 12 in (305 × 305 mm) glass sheet (U.S. Pat. Nos. 5,512,107; 5,948,176; 5,994,163; 6,040,521; 6,137,048; and 6,258,620).

What is claimed is:

1. A solar cell module comprising a solar cell layer and a sheet comprising at least one layer of a blend composition of ethylene copolymers, wherein (A) the solar cell layer comprises a single solar cell or a plurality of electrically interconnected solar cells; and (B) the blend composition has a melt flow rate of less than 100 g/10 min, as determined in accordance with ASTM D1238 at 190° C. and 2.16 kg, and comprises:

I. about 5 to about 95 wt % of an ethylene copolymer A, based on the total weight of the blend composition, wherein the ethylene copolymer A comprises copolymerized units of ethylene and about 3 to about 20 wt % of a comonomer selected from the group consisting of esters of $C_4$-$C_8$ unsaturated acids having two carboxylic acid groups, anhydrides of $C_4$-$C_8$ unsaturated acids having two carboxylic acid groups, and mixtures thereof, based on the total weight of the ethylene copolymer A; and II. about 5 to about 95 wt % of an ethylene copolymer B, based on the total weight of the blend composition, wherein ethylene copolymer B comprises copolymerized units of ethylene and about 6 to about 40 wt % of at least one polar monomer selected from the group consisting of vinyl acetate, alkyl acrylates, alkyl methacrylates, and mixtures of any two or more thereof, based on the total weight of the ethylene copolymer B, with the proviso that ethylene copolymer A and ethylene copolymer B are chemically distinct.

2. The solar cell module of claim 1, wherein the blend composition comprises about 5 to about 40 wt % of the ethylene copolymer A and about 60 to about 95 wt % of the ethylene copolymer B.

3. The solar cell module of claim 1, wherein the esters of the $C_4$-$C_8$ unsaturated acids having two carboxylic acid groups are selected from the group consisting of monoesters of $C_4$-$C_8$ unsaturated acids having two carboxylic acid groups, diesters of $C_4$-$C_8$ unsaturated acids having two carboxylic acid groups, and mixtures of any two or more thereof.

4. The solar cell module of claim 3, wherein the ethylene copolymer A comprises about 8 to about 15 wt % of copolymerized units of ethyl hydrogen maleate.

5. The solar cell module of claim 1, wherein the ethylene copolymer B comprises about 12 to about 32 wt % of copolymerized units of the at least one polar monomer.

6. The solar cell module of claim 1, wherein the at least one polar monomer is vinyl acetate.

7. The solar cell module of claim 1, the at least one polar monomer is selected from the group consisting of $C_1$-$C_6$ alkyl acrylates, $C_1$-$C_6$ alkyl methacrylates, and mixtures of two or more thereof.

8. The solar cell module of claim 1, wherein the sheet comprising the blend composition is in the form of a monolayer that consists essentially of the blend composition.

9. The solar cell module of claim 1, wherein the sheet comprising the blend composition is in the form of a multilayer sheet and has two or more sub-layers, and wherein at least one of the sub-layers consists essentially of the blend composition and each of the other sub-layers present in the multilayer sheet comprises at least one polymer selected from the group consisting of acid copolymers, ionomers of acid copolymers, ethylene/vinyl acetate copolymers, poly(vinyl acetals), polyurethanes, polyvinylchlorides, polyethylenes, polyolefin block copolymer elastomers, copolymers of an α-olefin and an α,β-ethylenically unsaturated carboxylic acid, silicone elastomers, epoxy resins, and combinations of two or more thereof.

10. The solar cell module of claim 1, wherein the sheet comprising the blend composition is in the form of a bi-layer sheet having two sub-layers, and wherein one of the two sub-layers consists essentially of the blend composition and has a thickness of about 0.5 to about 15 mils (about 13 to about 381 μm).

11. The solar cell module of claim 1, wherein the sheet comprising the blend composition is in the form of a tri-layer sheet having an inner sub-layer sandwiched between two surface sub-layer, and wherein the each of the two surface sub-layers consists essentially of the blend composition and has a thickness of 0.5 to about 15 mils (about 13 to about 381 μm).

12. The solar cell module of claim 1, wherein the solar cell layer has a front sun-facing side and a back non-sun-facing side.

13. The solar cell module of claim 12, which comprises a front encapsulant layer laminated to the sun-facing side of the solar cell layer and a back encapsulant layer laminated to the non-sun-facing side of the solar cell layer, wherein one of the front and back encapsulant layers is the sheet comprising the blend composition and the other of the front and back encapsulant layers comprises a polymeric material selected from the group consisting of copolymers of an α-olefin and an α,β-ethylenically unsaturated carboxylic acids, ionomers of copolymers of an α-olefin and an α,β-ethylenically unsaturated carboxylic acid, ethylene/vinyl acetate copolymers, poly (vinyl acetals), polyurethanes, polyvinylchlorides, polyethylenes, polyolefin block copolymer elastomers, copolymers of an α-olefin and an α,β-ethylenically unsaturated carboxylic acid, silicone elastomers, epoxy resins, and combinations thereof.

14. The solar cell module of claim 12, further comprising an incident layer, wherein the incident layer is an outermost surface layer of the module and is positioned on the sun-facing side of the solar cell layer, and wherein the incident layer is selected from the group consisting of (a) glass sheets, (b) polymeric sheets comprising a polymer selected from the group consisting of polycarbonates, acrylics, polyacrylates, cyclic polyolefins, polystyrenes, polyamides, polyesters, fluoropolymers, and combinations of two or more thereof, and (c) polymeric films comprising a polymer selected from the group consisting of polyesters, polycarbonate, polyolefins, norbornene polymers, polystyrene, styrene-acrylate copolymers, acrylonitrile-styrene copolymers, polysulfones, nylons, polyurethanes, acrylics, cellulose acetates, cellophane, poly(vinyl chlorides), fluoropolymers, and combinations of two or more thereof.

15. The solar cell module of claim 12, further comprising a backing layer, wherein the backing layer is an outermost surface layer of the module and is positioned on the non-light receiving side of the solar cell layer, and wherein the backing layer is selected from the group consisting of (a) glass sheets, (b) polymeric sheets, (c) polymeric films, (d) metal sheets, and (e) ceramic plates, and wherein the polymeric sheets comprise a polymer selected from the group consisting of polycarbonates, acrylics, polyacrylates, cyclic polyolefins, polystyrenes, polyamides, polyesters, fluoropolymers, and combinations or two or more thereof; and the polymeric films comprise a polymer selected from the group consisting of polyesters, polycarbonates, polyolefins, norbornene polymers, polystyrenes, styrene-acrylate copolymers, acrylonitrile-styrene copolymers, polysulfones, nylons, polyurethanes, acrylics, cellulose acetates, cellophanes, poly(vinyl chlorides), fluoropolymers, and combinations of two or more thereof.

16. The solar cell module of claim 12, wherein the solar cells are wafer-based solar cells selected from the group consisting of crystalline silicon (c-Si) and multi-crystalline silicone (mc-Si) based solar cells and the module consists essentially of, in order of position, (a) an incident layer, (b) a front encapsulant layer laminated to the sun-facing side of the solar cell layer, (c) the solar cell layer, (d) a back encapsulant layer laminated to the non-light receiving side of the solar cell layer, and (e) a backing layer, and wherein one or both of the front and back encapsulant layers comprises the blend composition.

17. The solar cell module of claim 12, wherein the solar cells are thin film solar cells selected from the group consisting of amorphous silicon (a-Si), microcrystalline silicon (µc-Si), cadmium telluride (CdTe), copper indium selenide (CIS), copper indium/gallium diselenide (CIGS), light absorbing dyes, and organic semiconductor based solar cells, and wherein the solar cell module consists essentially of, in order of position, (a) an incident layer, (b) a front encapsulant layer comprising the sheet comprising the blend composition, and (c) the solar cell layer, wherein the solar cell layer further comprises a substrate upon which the thin film solar cells are deposited and the substrate is positioned such that the substrate is an outermost surface of the module and is positioned on the non-sun-facing side of the solar cell layer.

18. The solar cell module of claim 12, wherein the solar cells are thin film solar cells selected from the group consisting of amorphous silicon (a-Si), microcrystalline silicon (µc-Si), cadmium telluride (CdTe), copper indium selenide (CIS), copper indium/gallium diselenide (CIGS), light absorbing dyes, and organic semiconductor based solar cells, and wherein the solar cell module consists essentially of, in order of position, (a) the solar cell layer, (b) a back encapsulant layer comprising the sheet comprising blend composition, and (c) a backing layer, wherein the solar cell layer further comprises a superstrate upon which the thin film solar cells are deposited and the superstrate is positioned such that the superstrate is an outermost surface of the module on the sun-facing side of the solar cell layer.

* * * * *